(12) United States Patent
Santoro et al.

(10) Patent No.: US 10,063,250 B1
(45) Date of Patent: Aug. 28, 2018

(54) APPARATUS AND METHOD FOR PROCESSING AN INPUT VOLTAGE

(71) Applicant: Infineon Technologies AG, Neubiberg (DE)

(72) Inventors: Francesco Santoro, Tavagnacco (IT); Bernhard Eisgruber, Villach (AT); Peter Bogner, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 5 days.

(21) Appl. No.: 15/589,715

(22) Filed: May 8, 2017

(51) Int. Cl.
*H03M 1/66* (2006.01)
*H03M 1/10* (2006.01)

(52) U.S. Cl.
CPC ........... *H03M 1/66* (2013.01); *H03M 1/1009* (2013.01)

(58) Field of Classification Search
CPC .... H03M 1/66; H03M 1/1009; H03M 1/1023; H03M 1/0691; H03M 1/804; H03M 1/1245; H03M 1/1215
USPC .................................................. 341/140–155
See application file for complete search history.

(56) References Cited

U.S. PATENT DOCUMENTS

| | | | | |
|---|---|---|---|---|
| 6,720,896 B2* | 4/2004 | Semmler | ............. | H03M 1/1023 341/120 |
| 8,902,093 B1* | 12/2014 | Leuciuc | ............. | H03M 1/1245 341/118 |
| 9,285,778 B1* | 3/2016 | Evans | ................... | G04F 10/005 |
| 2002/0126033 A1* | 9/2002 | Semmler | ............. | H03M 1/1023 341/158 |
| 2010/0117687 A1* | 5/2010 | Wong | ................... | G11C 27/026 327/94 |

\* cited by examiner

*Primary Examiner* — Lam T Mai
(74) *Attorney, Agent, or Firm* — Dicke, Billig & Czaja, PLLC

(57) ABSTRACT

A method of processing an input voltage. The method includes, during a sampling phase, using a digital-to-analog converter (DAC) capacitor to sample a reference voltage. The method includes, during a charge redistribution phase, using an input voltage to charge the DAC capacitor.

30 Claims, 6 Drawing Sheets

US 10,063,250 B1

APPARATUS AND METHOD FOR PROCESSING AN INPUT VOLTAGE

FIELD OF INVENTION

The present disclosure relates to a circuit for processing an input voltage by using a threshold voltage.

BACKGROUND

An analog-to-digital converters (ADC) are used in digital controllers. The ADC typically includes a digital-to-analog converter (DAC) and a comparator that is used to continuously compare an input voltage with a voltage generated by the DAC. Based on a digital switch signal obtained from the comparator, capacitors are selectively switched and alternately charged and discharged. The switched capacitors require a well-defined and stable reference voltage source.

SUMMARY

In one embodiment, a method of processing an input voltage includes, during a sampling phase, using a DAC capacitor to sample a reference voltage, and during a charge redistribution phase, using an input voltage to charge the DAC capacitor.

In one embodiment, a circuit for processing an input voltage includes a comparator and a DAC capacitor. The DAC capacitor is coupled between an input node to the circuit and a sense node of the comparator. The DAC capacitor is configured to sample, during a sampling phase, a reference voltage, and to be charged, during a charge redistribution phase, by an input voltage.

In one embodiment, a circuit is provided for converting a first direct voltage to a second direct voltage. The circuit includes an analog-to-digital converter configured to form a digital representation of an analog direct voltage. The analog-to-digital converter includes a DAC capacitor coupled between an input node of the circuit set to the analog direct voltage and a sense node of a comparator. The DAC capacitor is configured to sample the analog direct voltage.

Those skilled in the art will recognize additional features and advantages upon reading the following detailed description, and upon viewing the accompanying drawings

BRIEF DESCRIPTION OF THE DRAWINGS

In the following detailed description, reference is made to the accompanying drawings, in which are shown by way of illustration specific examples in which the disclosure may be practiced. In this regard, directional terminology, such as "top", "bottom", "front", "back", "leading", "trailing", etc., may be used with reference to the orientation of the figures being described. Because components of examples can be positioned in a number of different orientations, the directional terminology may be used for purposes of illustration and is in no way limiting.

The accompanying drawings are included to provide a further understanding of aspects and are incorporated in and constitute a part of this specification. The drawings illustrate aspects and together with the description serve to explain principles of aspects. Other aspects and many of the intended advantages of aspects will be readily appreciated as they become better understood by reference to the following detailed description. The illustrated components are not to scale or not necessarily to scale. Similar reference numbers in the individual figures designate similar parts.

DETAILED DESCRIPTION

Figure 1:
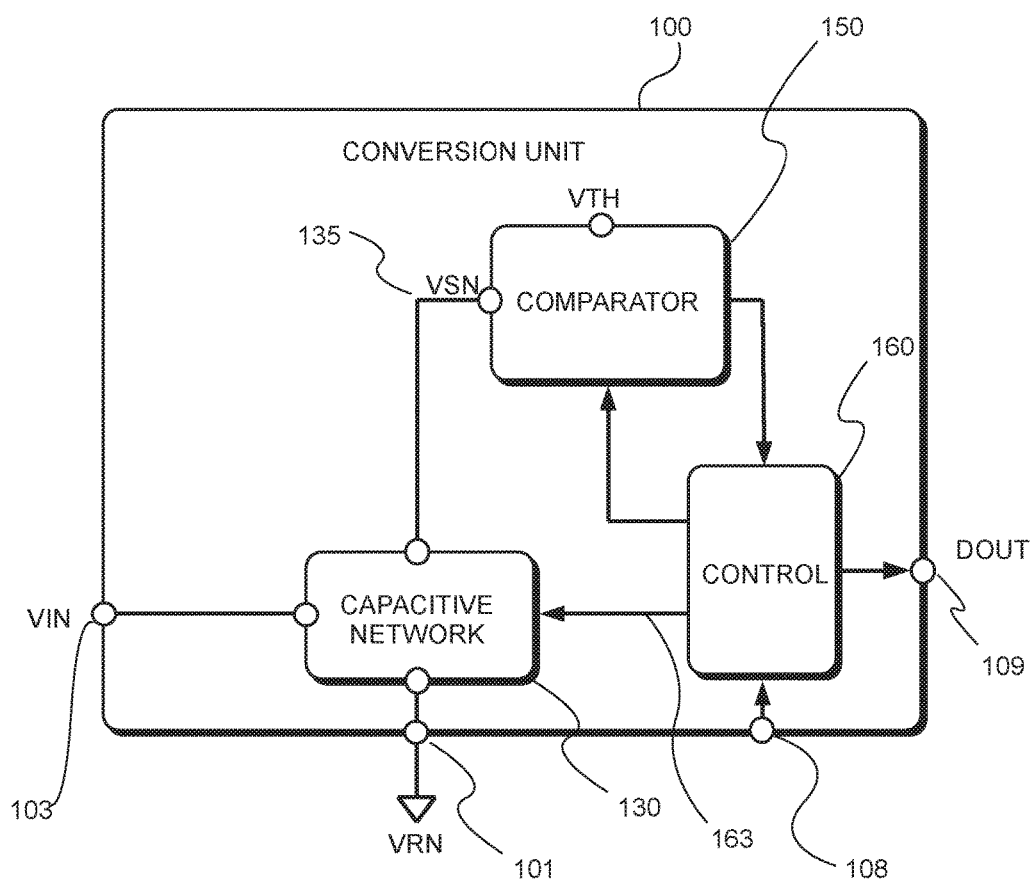
FIG. 1 shows a block diagram that schematically illustrates a circuit in some embodiments.

FIG. 1 shows a block diagram that schematically illustrates an exemplary embodiment of a circuit 100 for processing an input voltage provided by an input voltage source. For example, the input voltage source can be used to supply a load circuit (not shown) with power. In one embodiment, based on the input voltage, control information is derived for use in controlling the voltage source and, thus, to control the voltage supply to the load circuit. In various embodiments, the circuit 100 can be configured to convert a first direct voltage to a second direct voltage (DC/DC conversion). However, these embodiments of the circuit 100 for a DC/DC conversion should not be understood as limiting. In other embodiments, other applications and/or implementations of circuit 100 can be used.

In the illustrated embodiment, circuit 100 includes an input terminal 103. The input terminal 103 is configured to be set to an input voltage VIN, for example, an analog direct-current voltage. Circuit 100 includes an analog-to-digital converter (ADC). The ADC can be configured to form a digital representation of an analog direct voltage. In some embodiments, the circuit 100 is configured to control a voltage source (not shown) that provides the input voltage VIN.

The circuit 100 further includes a digital output terminal 109. In the illustrated embodiment, circuit 100 is configured as a comparator function circuit block, briefly also referred to as a 'comparator block'. Accordingly, the circuit 100 includes a comparator circuit portion 150 that, via a circuit sense node 135 of the circuit 100, is coupled to the input terminal 103. In some embodiments, as will be described below, the coupling includes more circuitry than merely a direct line connection between the circuit sense node 135 of the comparator circuit portion 150 and the input terminal 103.

The circuit 100, in particular, the analog-to-digital converter of circuit 100, includes a digital-to-analog converter (DAC) capacitor arrangement 130. The DAC capacitor arrangement 130 is coupled between the input terminal 103 of the circuit 100 that can be set to the input voltage VIN and the circuit sense node 135. In the illustrated embodiment, the DAC capacitor arrangement 130 is configured to be charged by the input voltage VIN.

The circuit 100 includes a reference node that is, for reasons that will become apparent below, herein referred to as a first-level reference node 101. The first-level reference node 101 is configured to be set to a reference voltage that is herein referred to as a first-level reference voltage VRN. In some embodiments, the first-level reference voltage VRN is at a ground voltage level. The DAC capacitor arrangement 130 is coupled to the first-level reference node 101 to enable charging of the DAC capacitor arrangement 130 as will be described in more detail below.

In some embodiments, circuit 100 is configured to control a configuration of the DAC capacitor arrangement 130. Accordingly, the circuit 100 can include a control unit 160 that is coupled between the comparator circuit portion 150 and the digital output terminal 109. The circuit 100 includes a control input port 108 configured to receive control signals for processing and/or other use by the control unit 160. Further, the DAC capacitor arrangement 130 is coupled to the control unit 160 and configured to receive configuration signals for use in configuring the DAC capacitor arrangement 130.

In some embodiments, the circuit is configured to control, based on the configuration of the DAC capacitor arrangement 130, a voltage source (not shown) that provides the input voltage VIN. In some embodiments, the digital output signal DOUT can be provided at the output terminal 109 for use in control of, for example, the voltage source.

Figure 2:
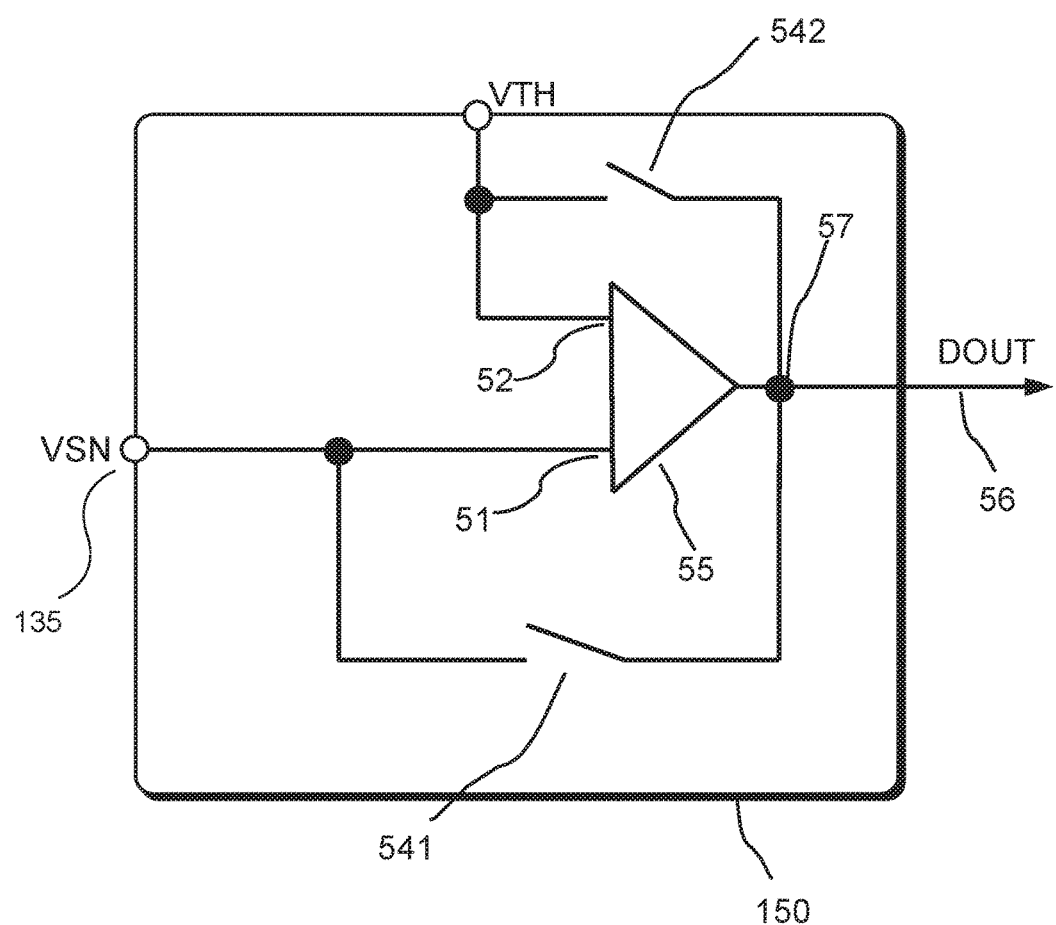
FIG. 2 shows a block diagram that illustrates an exemplary portion of the circuit shown in FIG. 1.

FIG. 2 shows a block diagram that illustrates an exemplary portion of the circuit shown in FIG. 1. In particular, FIG. 2 illustrates the comparator circuit portion 150. The comparator circuit-portion 150 includes a comparator circuit 55 having a comparator sense node 51 that is connected to the circuit sense node 135 of the circuit 100 and configured to sense a sense voltage VSN provided at the circuit sense node 135. In the illustrated embodiment, the comparator circuit 55 includes a threshold voltage sense node 52 that is configured to be set to a threshold voltage VTH. In some embodiments (not shown), the threshold voltage node is provided internally to the comparator circuit portion 150. The comparator circuit 55 is configured to compare the sense voltage VSN to the threshold voltage VTH. The comparator circuit 55 includes an output node 57 that is configured to output an output signal that reflects a result of the comparison. In some embodiments, the output node 57 is configured to output a digital comparator output signal DOUT onto a digital signal line 56, where the output signal has a predetermined first digital signal level if the sense voltage VSN exceeds the internal threshold voltage VTH, and where the output signal has a predetermined second digital signal level if the sense voltage VSN is below the internal threshold voltage VTH.

Some embodiments of the comparator circuit-portion 150 include a first common mode switch 541 that is coupled between the output node 57 and the comparator sense node 51 of the comparator circuit portion 150. The first common mode switch 541 can be closed, when initializing and/or resetting the comparator circuit portion 150 in order to bias the comparator circuit 55 to a threshold voltage level. Some embodiments of the comparator circuit-portion 150 include a second common mode switch 542. In some implementations, the second common mode switch 542 is coupled between the comparator output node 57 and the threshold voltage sense node 52. In some embodiments, the comparator circuit portion is configured to switch the first common mode switch 541 and the second common mode switch 542 synchronously in parallel. At least one effect can be that the second common mode switch 542 can be closed so as to set both nodes of the comparator circuit 55 to a same voltage. The comparator circuit 55 can be biased so as to have the digital output signal DOUT toggle between the first digital signal level and the second digital signal level.

In some embodiments, the circuit 100 is configured, during a sampling phase, to short-circuit the comparator sense node 51 of the comparator circuit 55 to a common mode node of a voltage generator, and, during a charge redistribution phase, to disconnect the comparator sense node 51 of the comparator circuit 55 from the common mode node of the voltage generator. In some embodiments, as in the embodiment shown in FIG. 2, the comparator circuit 55 is operative as the voltage generator. The output node 57 of the comparator circuit 55 also forms the common mode node of the voltage generator. Thus, the circuit 100 includes the common mode node 57 and is configured to set the comparator sense node 51 to a same common mode voltage VCM as the voltage VTH at the threshold node.

Figure 3:
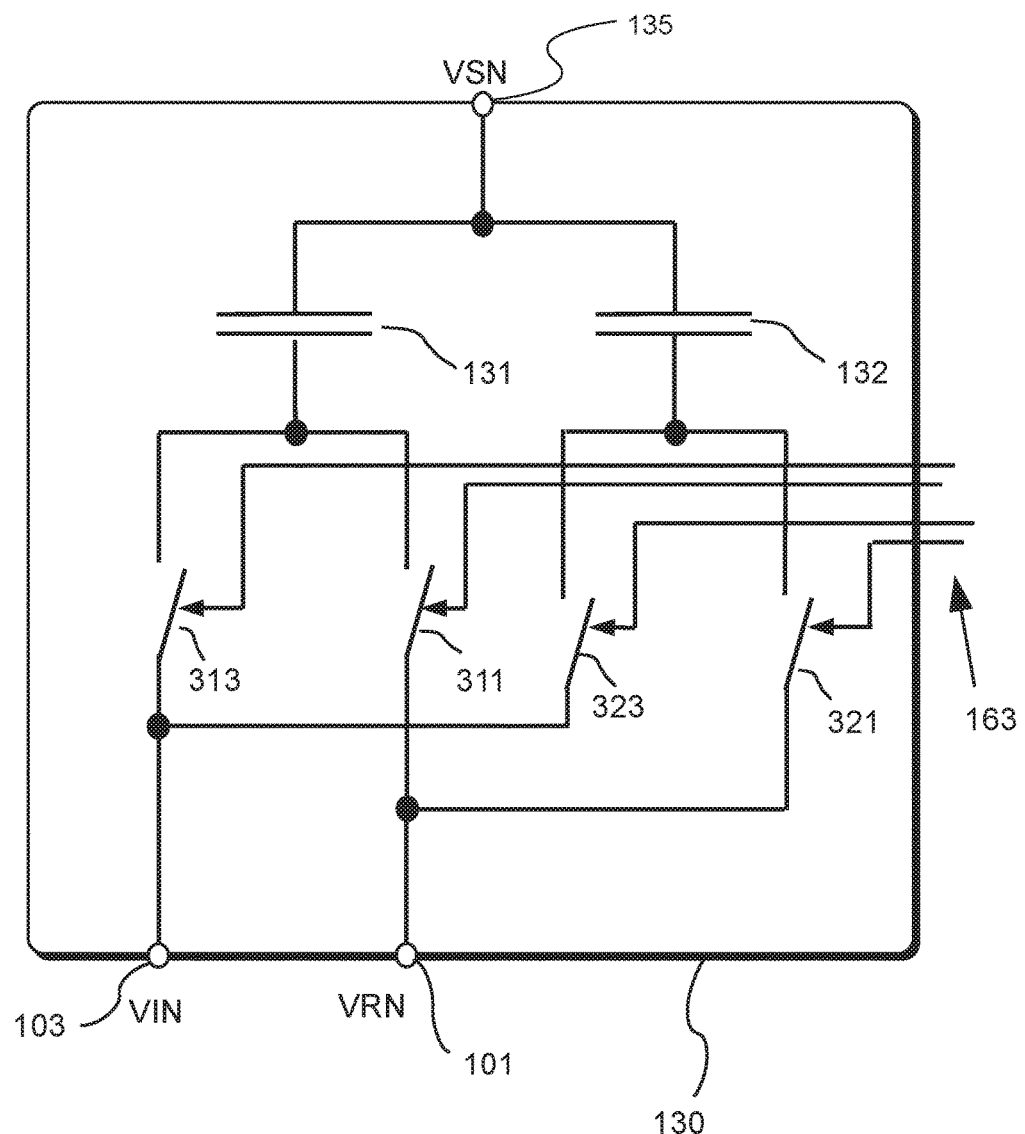
FIG. 3 shows a block diagram that illustrates another exemplary portion of the circuit shown in FIG. 1.

FIG. 3 shows a block diagram that illustrates another exemplary portion of the circuit 100 shown in FIG. 1. In particular, FIG. 3 illustrates some embodiments of the DAC capacitor arrangement 130. In the embodiments illustrated in FIG. 3, a first terminal of the DAC capacitor arrangement 130 is coupled to the circuit sense node 135, and thus to the comparator sense node 51 of the comparator circuit 55 (not shown in FIG. 3). A second terminal of the DAC capacitor arrangement 130 can be coupled to the first-level reference node 101 as well as to the input terminal 103 of the circuit 100. In some embodiments, the circuit 100 is configured to alternately connect the DAC capacitor arrangement 130 to the first-level reference voltage node 101 and to the input terminal 103 of the circuit 100.

For example, the DAC capacitor arrangement 130 can be provided as a capacitive network. The capacitive network can comprise a plurality of capacitors. Some or all of the plurality of capacitors can be provided as switched capacitors. For example, the DAC capacitor arrangement 130 includes a plurality of switched capacitors 131, 132. For example, in some embodiments, as illustrated in FIG. 3, a first capacitor 131 is connected to an input voltage switch 313 and to a first-level reference voltage switch 311. In these embodiments, a second capacitor 132 is connected to an input voltage switch 323 and to a first-level reference voltage switch 321. It should be understood that, although the number of capacitors illustrated for the capacitive network of the DAC capacitor arrangement 130 is two, this number is only to give an example and is not meant to limit the number of capacitors of the DAC capacitor arrangement 130.

In some embodiments, the plurality of switched capacitors 131, 132 are thermometer switched and non-linearly weighted. At least one effect can be that an inversion of an analog-to-digital converter output transfer function of the circuit 100 can be compensated. For example, the circuit 100 may have a transfer function of the form 1/x which is incompatible with a binary DAC transfer function. However, using thermometer coding enables a linear output function. The thermometer coded capacitors of the capacitor arrangement can be sized differently from one another. Thus, the size of individual capacitors of the DAC capacitor arrangement 130 can be adapted to compensate the 1/x transfer function.

In some embodiments, the configuration of the DAC capacitor arrangement 130 includes settings of the switches 313, 311, 323, 321 connected to the plurality of switched capacitors 131, 132. In some embodiments, the circuit 100 is configured to determine the configuration of the DAC capacitor arrangement 130 at the end of the charge redistribution phase.

In some embodiments, the control unit 160 (not shown in FIG. 3) is configured to control the DAC capacitor arrangement 130. In particular, in some implementations, the control unit 160 is configured to control at least one switched capacitor 131, 132. The control unit 160 can be configured to process the digital comparator output signal DOUT received from the comparator circuit portion 150 (not shown in FIG. 3) to configure, based on the signal, the DAC capacitor arrangement 130. For example, the control unit 160 can be provided as a logic circuit. In some embodiments, the control unit 160 is configured to base control of the at least one switched capacitor 131, 132 on the digital comparator output signal DOUT formed while the DAC capacitor arrangement 130 is set to the first-level reference voltage level VRN.

In some embodiments, the control unit 160 is configured to control the switched capacitor 131, 132 so as to compensate, at the comparator sense node 51, a comparator offset voltage. In some embodiments, the control unit 160 is configured to control the switched capacitors 131, 132 so as to set an effective threshold voltage to a predetermined value. For example, the control unit 160 can be configured to output a plurality of digital switch signals, each digital switch signal to a control link 163 in order to control one switched capacitor of the plurality of switched capacitors that include a first switched capacitor 131 and a second switched capacitor 132. In such an implementation, the control link 163 can include a plurality of control lines, each to connect to a different one of first-level DAC capacitor switches 311, 321. In some embodiments, the control unit 160 is configured to control the first common mode switch 541 and the second common mode switch 542 so as to have the first common switch 541 and the second common mode switch 542 closed while the first-level DAC capacitor switch 311, 321 is closed. At least one effect can that the DAC capacitor arrangement 130 can be charged, for example, during a charge phase provided to recharge the reference capacitor to the first level reference voltage VRN. In some embodiments, the control unit 160 is configured to have the DAC capacitor arrangement 130 repeatedly charged. In some embodiments, the control unit is configured to have the DAC capacitor arrangement 130 periodically charged. A duration of a period can be constant and predetermined. In some implementations, the duration can be subject to control by the control unit 160.

Next, embodiments of operation of the circuit 100 will be described. Generally, the circuit 100 can enter, for example, at start-up of the circuit 100 or after a reset of the circuit 100, an initialization phase, which is sometimes also referred to as a calibration phase. Then, at least two phases can be distinguished that alternate in an essentially continuous operation of the circuit 100. These are a first phase that is an initialization phase, sometimes also called a charge phase and herein also referred to as sampling phase, and a second phase that is an operative phase herein referred to as charge redistribution phase.

In some implementations, during the initialization or sampling phase, the method includes calibrating the comparator circuit 55. In particular, the method includes short-circuiting the comparator sense node 51 to the comparator output node 57. In particular, the first common mode switch 541 of the comparator circuit portion 150 and the second common mode switch 542 are closed. At least one effect can be that the comparator circuit 55 is effective as a voltage generator and, thus, the comparator output node 57 is effective as the common mode node of the voltage generator. The comparator circuit 55 operates as a voltage generator that sets the comparator sense node 51 to a common mode voltage formed at the output node 57 of the comparator circuit 55.

During the sampling phase, in some embodiments, the DAC capacitor arrangement 130 samples the first-level reference voltage VRN. In some embodiments, the first-level DAC capacitor switches 311 and 321 are closed, while the input voltages switches 313 and 323 are open. Thus, the first capacitor 131 and the second capacitor 132 are connected to the first-level reference voltage node 101 so as to charge the DAC capacitor arrangement 130 to the first-level reference voltage VRN.

Further, in some embodiments, still during the sampling phase, the DAC capacitor arrangement 130 is configured. In particular, the control unit 160 provides control signals to the switches of the DAC capacitor arrangement 130 to set the switches so as to charge the first capacitor 131 and the second capacitor 132 of the DAC capacitor arrangement 130. At least one effect can be that, during the initialization phase, essentially all capacitors of the circuit 100 are charged.

Control of the first switched capacitor 131 can be performed by using the DAC capacitor switches 313, 311. Control of the second switched capacitor 132 can be performed by using the DAC capacitor switches 323, 321. The control can be performed such that charge on the first switched capacitor 131 and on the second switched capacitor 132 contribute to the sense-node voltage VSN so as to provide the effective threshold voltage of the comparator circuit 55 as needed. Thus, the comparator circuit 55 can be set to a desired effective threshold voltage. In some embodiments, therefore, the initialization phase can be performed whenever a setting of an effective threshold voltage is desired.

In some embodiments, the initialization is extended to perform a further calibration of the comparator circuit 55, for example, to take account of a comparator offset introduced when opening the first common mode switch 541 and the second common mode switch 542 from the closed setting during the sampling phase.

Once the first common mode switch 541 and the second common mode switch 542 are opened, the circuit 100 is configured to operate in the charge redistribution phase. The sampling phase ends at this point to alternate with the charge redistribution phase.

During the charge redistribution phase, the input voltage VIN can also be used to charge the DAC capacitor arrangement 130. In particular, depending on the configuration of the DAC capacitor arrangement 130, i.e., on the settings of the switches 313, 311, 323, 321, the first capacitor 131 and/or the second capacitor 132 are connected to the input voltage terminal 103 so as to charge the DAC capacitor arrangement 130 to the input voltage VIN. In some embodiments, alternatively to being charged by the input voltage VIN, by controlling the switches 313, 311, 323, 321, the capacitors 131, 132 of the DAC capacitor arrangement 130 can be controlled to be selectively charged by the first-level reference voltage VRN. For example, if the input voltage switch 313 of the first switched capacitor 131 is closed, while the DAC capacitor switch 311 of the first switched capacitor 131 is open, the first switched capacitor 131 is charged to the input voltage VIN. At the same time, the second switched capacitor 132 is charged to the first-level reference voltage VRN if the input voltage switch 323 of the second switched capacitor 132 is open while the DAC capacitor switch 321 of the second switched capacitor 132 is closed. The skilled person can contemplate other configurations of the DAC capacitor arrangement 130 where the input voltage switch 313, 323 of one DAC capacitor 131, 132 is not closed at the same time as the DAC capacitor switch 311, 321 of that same DAC capacitor 131, 132, respectively.

In some implementations, during the charge redistribution phase, the control unit 160 configures the DAC capacitor arrangement 130 based on the comparator output signal DOUT. In particular, the control unit 160 can set the DAC capacitor switches 313, 311, 323, 321. In particular, the method can comprise, during the charge redistribution phase, tracking the input voltage by setting DAC capacitor switches 313, 311, 323, 321. At least one effect can be that, during the charge redistribution phase, the input voltage VIN is successively approximated. Thus, at the end of the charge redistribution phase, the configuration of the DAC capacitor arrangement 130, i.e., the settings of the DAC capacitor switches 313, 311, 323, 321, represents a level of the input voltage VIN. At least one effect can be that, based on the information represented by the configuration of the DAC capacitor arrangement 130, the voltage source (not shown) that generates the input voltage VIN can be controlled.

In some embodiments, the method includes, during the charge redistribution phase, controlling the voltage source to keep the input voltage VIN essentially constant. At least one effect can be that the voltage source can provide a particularly stable input voltage VIN to the load circuit (not shown). At least one effect can be that the input voltage VIN provided by the voltage source (not shown in the FIGS) is used to charge the DAC capacitor arrangement 130. Thus, where the input voltage source is low-resistance, as typically is the case, for example, when the circuit 100 is used to control a power supply of a microcontroller and/or a DC/DC converter, the circuit 100 can use the input voltage VIN rather than a reference voltage source such as a power supply. In particular, since the reference voltage source may be provided as a high-resistance band gap voltage source, a buffer that would otherwise be needed in order to provide the low impedance voltage source may not be required to provide a stable reference voltage VRN.

Alternate embodiments of a circuit according to the invention in an aspect will now be described with reference to FIG. 4 which show a block diagram that schematically illustrates a circuit 200 in some embodiments. In various embodiments, the circuit 200 is configured similarly to the circuit described above with reference to FIG. 1. Like the circuit 100 described above with reference to FIGS. 1 to 3, the circuit 200 is configured as a comparator block.

The circuit 200 includes an input terminal 203 to the circuit 200. The input terminal 203 is configured to be set to an input voltage VIN, for example, an analog direct-current voltage. The circuit 200 includes a comparator circuit portion 250 that, using a circuit sense node 235 of the circuit 200, is coupled to the input terminal 203. In some embodiments, as will be described below, coupling includes more circuitry than merely a direct line connection of the circuit sense node 235 of the comparator circuit portion 250 to the input terminal 203. The comparator circuit portion 250 can, in some implementations, be like the comparator circuit portion 150 that is described above with reference to FIG. 2. The circuit 200 further includes a digital output terminal 209.

The circuit 200 includes a digital-to-analog converter (DAC) capacitor arrangement 230. The DAC capacitor arrangement 230 is coupled between the input terminal 203 to the circuit 200 that can be set to the input voltage VIN and the circuit sense node 235. In the example, the DAC capacitor arrangement 230 is configured to be charged by the input voltage VIN.

The circuit 200 includes a first-level reference node 201 configured to be set to a first-level reference voltage VRN that, for example, may be ground voltage level. The DAC capacitor arrangement 230 is coupled to the first-level reference node 201 to enable charging of the DAC capacitor arrangement 130.

In some embodiments, the circuit 200 includes a control unit 260 that is coupled between the comparator circuit portion 250 and the digital output terminal 209. The control unit 260 is configured to control a configuration of the DAC capacitor arrangement 230. The circuit 200 includes a control input port 208 configured to receive control signals for processing and/or other use by the control unit 260. Further, the DAC capacitor arrangement 230 is coupled to the control unit 260 which is configured to receive configuration signals for use in configuring the DAC capacitor arrangement 230.

The circuit 200, in some embodiments, differs from the circuit 100 in that the circuit 200 includes an input portion 240. The input portion 240 can be coupled between the input terminal 203 and the comparator circuit portion 250. In particular, the input portion 240 can be coupled between the input terminal 203 and the circuit sense node 235.

Figure 4:
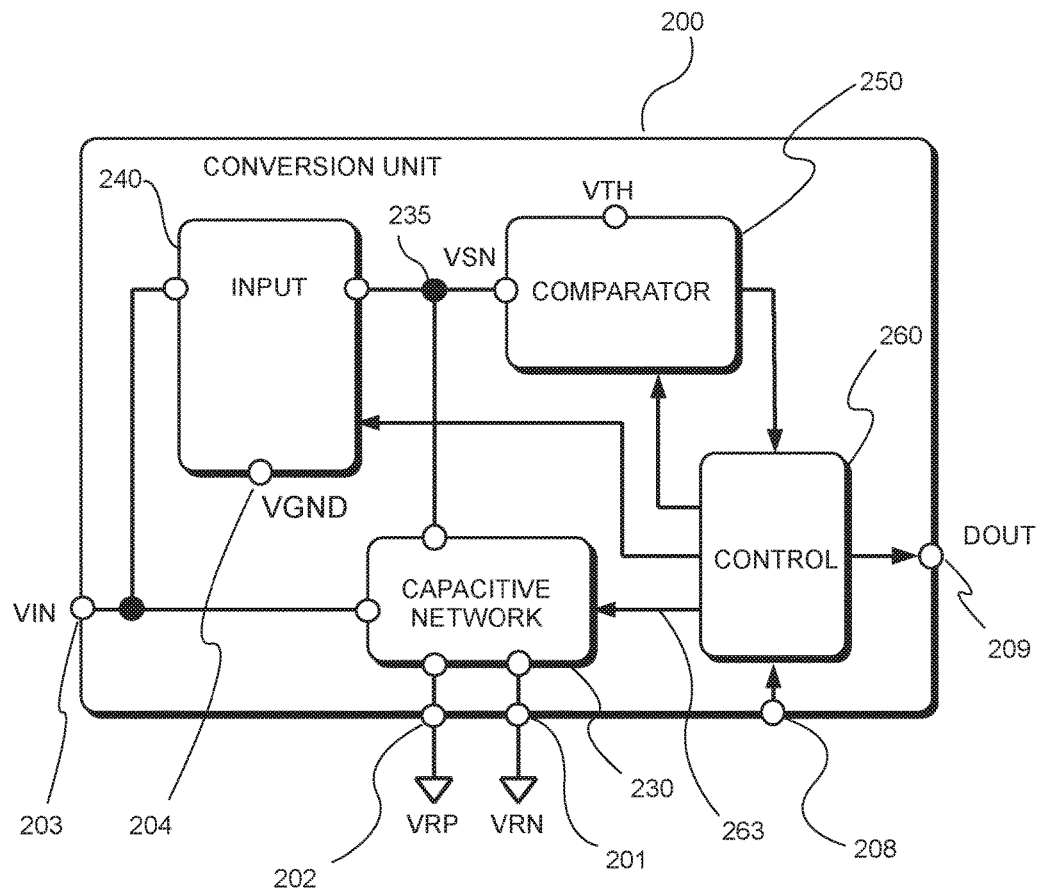
FIG. 4 shows a block diagram that schematically illustrates a circuit in some embodiments.
Figure 5:
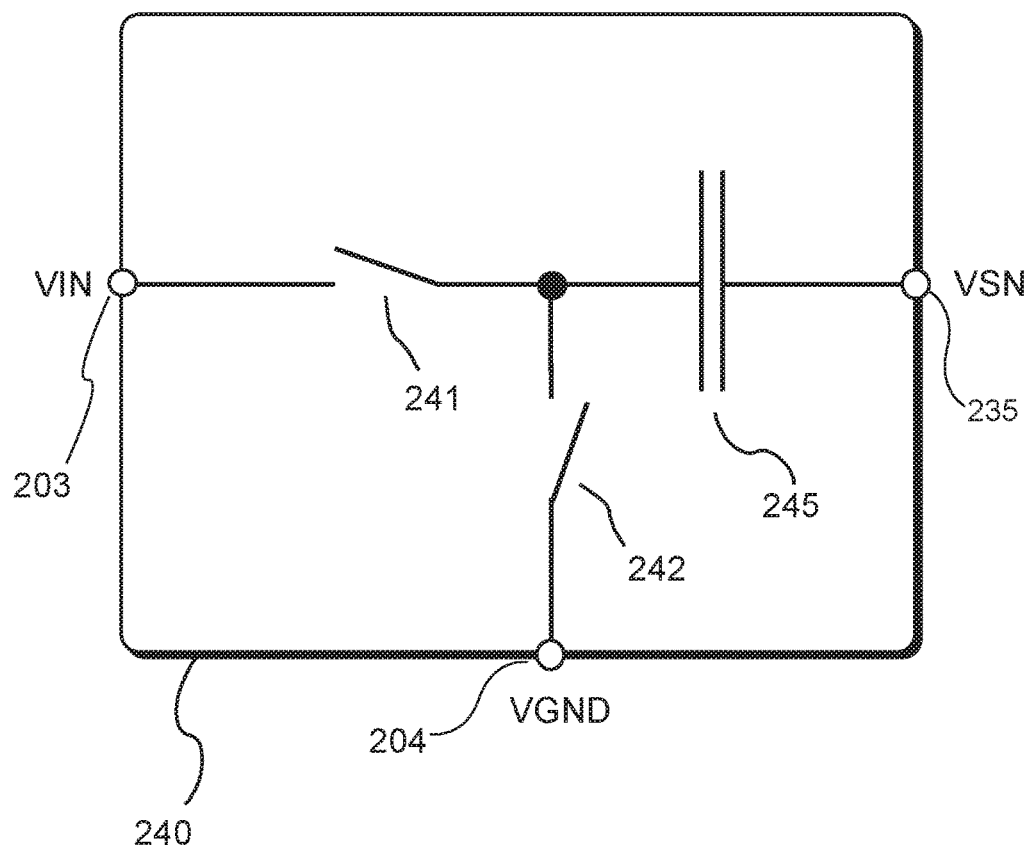
FIG. 5 shows a block diagram that illustrates an exemplary portion of the circuit shown in FIG. 4.

FIG. 5 shows a block diagram that illustrates an exemplary portion of the circuit shown in FIG. 4. In particular, the block diagram illustrates the input portion 240 of the circuit 200. According to some embodiments, the input portion 240 includes an input capacitor 245. In some embodiments, the input capacitor 245 is coupled between a bias voltage node 204 of the circuit 200 and the sense node of the comparator (not shown in FIG. 4). The bias voltage node 204 can be set to a predetermined bias voltage, herein also referred to as reference input voltage, such as a voltage at ground VGND. In particular, a first terminal of the input capacitor 245 can be coupled to the bias voltage node 204 and a second terminal of the input capacitor 245 can be coupled to the circuit sense node 235 that is coupled to the sense node of the comparator.

In some embodiments, the circuit 200 is configured to alternately connect the input capacitor 245 to the bias voltage node 204 and to the DAC capacitor arrangement 230 (not shown in FIG. 4). For example, the input portion 240 can comprise an input switch 241 coupled between the input terminal 203 and the input capacitor 245 and a bias switch 242 coupled between the bias voltage node 204 and the input capacitor 245.

An exemplary implementation or operation of the circuit 200 is similar to the operation of the circuit 100 described above with reference to FIGS. 1 to 3. However, the exemplary circuit 200 described above with reference to FIGS. 4 and 5 includes the input capacitor 245 connected to the circuit sense node 235 and, thus, being coupled to the comparator 250. The circuit 200 can be configured such that, during the sampling phase, the input capacitor 245 is connected to the bias voltage node 204. For example, in some embodiments, the control unit 260 is configured to control the input switch 241 so as to open the input switch 241 during the sampling phase and to close the input switch 241 during the charge redistribution phase. Likewise, in some embodiments, the control unit 260 is configured to control the bias switch 242 so as to close the bias switch 242 during the sampling phase and to open the bias switch 242 during the charge redistribution phase.

Figure 6:
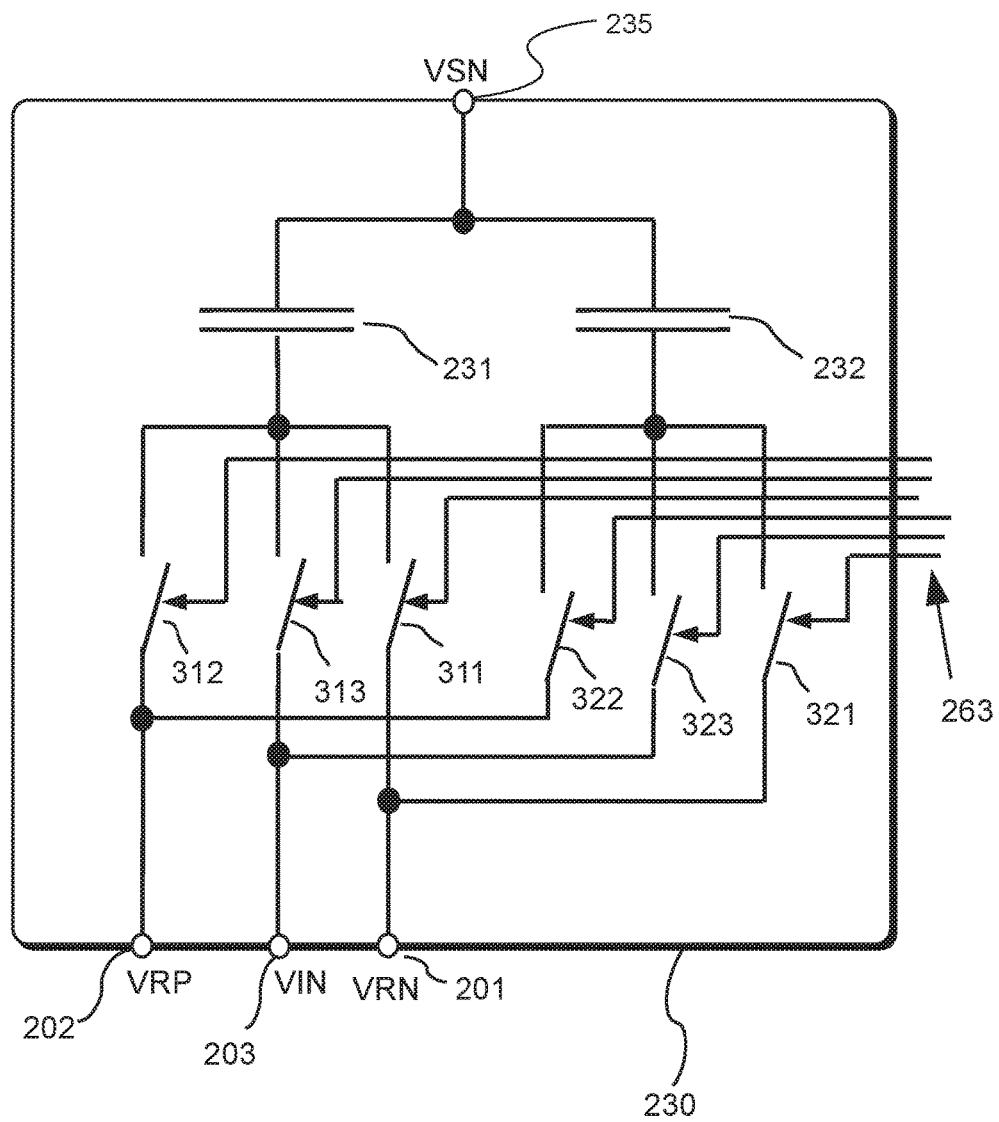
FIG. 6 shows a block diagram that illustrates another exemplary portion of the circuit shown in FIG. 4.

FIG. 6 shows a block diagram that illustrates another exemplary detail of the circuit shown in FIG. 4. In some embodiments, the circuit 200, in addition to the first-level reference node 201, includes a second-level reference node 202. In embodiments as illustrated in FIG. 6, the second-level reference node 202 is configured to provide the reference voltage. This contrasts with the embodiments disclosed above with reference to FIG. 3, where the reference voltage is provided by the first-level reference node 201.

The circuit illustrated in FIGS. 4, 5 and 6 is configured alternately to connect the DAC capacitor arrangement 230 to the second-level reference voltage node 202 and either to the input voltage node 203 or to the first-level reference voltage node 201. In some embodiments, the second-level reference voltage VRP differs from the first-level reference voltage VRN by semiconductor band-gap voltage. In some embodiments, the plurality of switched capacitors 231, 232 are configured to be selectively set to connect to the input voltage node VIN or to the first-level reference voltage node 201. In some embodiments (not shown), the second-level reference voltage VRP forms the predetermined bias voltage VGND. In some embodiments (not shown), the bias voltage node 204 is set to the second-level reference voltage VRP of the second-level reference voltage node 202. Thus, a source of the second-level reference voltage VRP also provides the bias voltage VGND=VRP.

In some embodiments, during the charge redistribution phase, alternatively to being charged by the input voltage VIN, by controlling the switches 313, 311, 323, 321, the capacitors 131, 132 of the DAC capacitor arrangement 130 can be controlled to be selectively charged by the first-level reference voltage VRN. For example, if the input voltage switch 313 of the first switched capacitor 131 is closed, while both the first-level DAC capacitor switch 311 of the first switched capacitor 131 and the second-level DAC capacitor switch 312 are open, the first switched capacitor 131 is charged to the input voltage VIN. At the same time, the second switched capacitor 132 is charged to the first-level reference voltage VRN if the input voltage switch 323 of the second switched capacitor 132 is open while the first-level DAC capacitor switch 321 of the second switched capacitor 132 is closed and the second-level DAC capacitor switch 322 is open. The skilled person can contemplate other configurations of the DAC capacitor arrangement 130 where the input voltage switch 313, 323 of one DAC capacitor 131, 132 is open at the same time as the first-level DAC capacitor switch 311, 321 of that same DAC capacitor 131, 132, respectively, is closed.

The operation of the exemplary circuit 200 is similar to the operation described above with reference to FIGS. 1 to 3. In an exemplary operation of the circuit 200 according to some embodiments, the exemplary circuit 200, during the charge redistribution phase, based on the comparator output signal DOUT, configures the DAC capacitor arrangement 230 by selectively switching switched capacitors 231, 232 of the DAC capacitor arrangement 230 to the input voltage VIN or to a second-level reference voltage VRP at the second-level reference node 202.

Now, an operation of the circuit 200 will be described in more detail with reference to FIG. 2 and FIGS. 4 to 6. As already described above with reference to an operation of the circuit illustrated in FIGS. 1 to 3, at least, two modes, states or phases of operation can be distinguished according to how switches in the circuit 200 are set. In particular, during the sampling phase, the input capacitor 245 can be used to sample the predetermined bias voltage VGND. It should be understood that the voltage at ground VGND can be any reference voltage defined as ground for the purpose of a given implementation. In some embodiments, where the second-level reference voltage VRP forms the predetermined bias voltage VGND, the input capacitor 245 can be used to sample the second-level reference voltage VRP. Below, the initialization or sampling phase and the charge redistribution phase will now be discussed with reference to FIGS. 4 to 6.

First, circuit 200 is initialized. The input terminal 203 is set to the input voltage VIN. The sampling phase is entered as described above using the example of the circuit 100.

During the initialization phase, in the input portion 240, the bias switch 242 is closed while the input switch 241 is open, i.e., during the sampling phase, though the input voltage VIN is supplied from the input terminal 203 to the input portion 240, the input voltage VIN does not charge the input capacitor 245. Therefore, the sense-node voltage VSN is not based on the input voltage VIN. Meanwhile, using the bias voltage node 204, the input portion 240 can tap into the predetermined bias voltage VGND, i.e., for example, where the bias voltage node 204 is a ground terminal, the input portion 240 can use the voltage at ground. Thus, the initialization of the circuit 200 includes, during the charge phase, charging the input capacitor 245 according to a difference of the sense-node voltage VSN to the voltage at ground VGND. In a continuous operation, thereby charge on the input capacitor 245, in effect, is refreshed. Accordingly, the initialization or sampling phase can also be referred to as a refresh phase.

Based on the predetermined bias voltage VGND, the input portion 240 contributes to a sense-node voltage VSN at the sense node 235 that is provided to the comparator circuit portion 250.

Still during the initialization phase, in the comparator circuit portion 250, the first common mode switch 541 is closed whereby the comparator sense node 51 is short circuited to the comparator output node 57. The second common mode switch 542 is closed whereby the comparator threshold voltage node 52 is short-circuited to the comparator output node 57, too. Thus, the comparator circuit 55 is operative to compare the sense-node voltage VSN, applied to the comparator sense node 51, to the threshold voltage VTH that is applied to the threshold voltage sense node 52. At least one effect can be that the comparator circuit 55 is effective as a voltage generator. In particular, the comparator output node 57 acts as a voltage generator that sets the comparator sense node 51, and, in some embodiments, also the threshold voltage sense node 52, to a common mode voltage VCM formed at the output node 57 of the comparator circuit 55, wherein the threshold voltage VTH is the common mode voltage VCM that is set to both, the comparator sense node 51 and the threshold voltage sense node 52.

The comparator circuit portion 250 provides a digital output signal voltage DOUT to the control unit 260. The control unit 260 can output the digital output signal DOUT to the output terminal 209 of the circuit 200, whence it can be transmitted to other circuitry (not shown) for further processing. In some implementations, based on the digital output signal DOUT, the control unit 260 forms a control signal. The control unit 260 outputs the control signal to a control link 263. The digital control signal DOUT is applied to the DAC capacitor arrangement 230.

In some implementations, the DAC capacitor arrangement 230, at the first-level reference voltage node 201, tabs a negative reference voltage VRN and, at the second-level reference voltage node 202, tabs a positive reference voltage VRP. Meanwhile, like the input portion 240, the capacitive network of the DAC capacitor arrangement 230 can contribute to the sense-node voltage VSN at the sense node 235.

Still during the initialization phase, in the DAC capacitor arrangement 230, the first switched capacitor 231 and the second switched capacitor 232 can be controlled by the control signal received from the control unit 260. Further, in some embodiments, the positive reference voltage VRP is used to charge the DAC capacitor arrangement 230.

Therefore, when compared with a conventional successive approximation register analog-to-digital converter (SAR-ADC) circuit, the circuit illustrated in FIGS. 4 and 5 operates with the roles of the input voltage VIN and the positive reference voltage VRP exchanged. During the sampling phase, instead of sampling the input voltage VIN, the input capacitor 245 samples the positive reference voltage VRP. And during the charge redistribution phase, instead of using the positive reference voltage VRP to charge the input capacitor 245, the circuit 200 uses the input voltage VIN or the negative reference voltage VRN. Thus, the circuit 200 can take advantage of a low-impedance voltage source (not shown) that, in some applications, can be sufficiently stable, constant or 'stiff' to supply energy for charging and refreshing of the input capacitor 245 as well as of the capacitors 231, 232 of the capacitive network in the DAC capacitor arrangement 230. Accordingly, corresponding requirements need not be so stringent on the bias voltage source (not shown). While the bias voltage source, in some embodiments, may be selected to provide high precision, for example, by implementing a bandgap voltage source, the bias voltage source may be a high-impedance voltage source. In some implementations, since the energy for charging capacitors of the circuit 200 is provided by the low impedance voltage source that feeds the input voltage VIN to the circuit 200, even though the bias voltage source can be of high impedance, no other buffer or other amplifier may be required to amplify the low-impedance voltage source.

For example, as described above, the sampling phase is performed during initialization when the input capacitor 245 and/or the DAC capacitor arrangement 230 are charged for use during the charge redistribution phase wherein the comparator circuit 55 processes the input voltage VIN to provide the sense-node voltage VSN for comparison to the threshold voltage VTH. Further, the sampling phase effects a refresh when the when the input capacitor 245 and/or the DAC capacitor arrangement 230 is recharged to replace charge that, for example during a previous operative phase, leaked from the respective capacitor.

Next, having charged the capacitors 231, 232 and 245 of the circuit 200, the charge redistribution phase is entered. During the charge redistribution phase, the method includes applying the input voltage VIN to the input capacitor 245. In particular, in the input portion 240, the input switch 241 is closed while the bias switch 242 is open, i.e., during the charge redistribution phase, the input voltage VIN is supplied from the input terminal 203 to the input portion 240 and charges the input capacitor 245. The input capacitor 245 is charged according to a difference of the sense-node voltage VSN to the input voltage VIN. Therefore, in a case where the DAC capacitor arrangement 230 is provided as the plurality of capacitors, charge can be redistributed from one capacitor to another of the plurality of capacitors including the input capacitor 245. In addition, the input voltage VIN provided at the voltage terminal 203 is used to redistribute charges amongst the capacitors 231, 232, 245 of the circuit 200. Based on the digital output signal DOUT, the control unit 260 can configure the DAC capacitor arrangement 230 such that settings of the switches form a digital representation of an approximation value of the input voltage VIN. In particular, in the embodiment shown in FIG. 6, these switches are the pair of input voltage switch 313 to the input terminal 203 and first-level DAC capacitor switch 311 to the first-level reference voltage node 201 that are coupled to the first switched capacitor 231, and the pair of input voltage switch 323 to the input terminal 203 and first-level DAC capacitor switch 321 to the first-level reference voltage node 201 that are coupled to the second switched capacitor 232.

An exemplary method of processing the input voltage VIN to provide the sense-node voltage VSN for comparison to the threshold voltage VTH includes configuring the DAC capacitor arrangement 230 coupled to the input capacitor 245. The method can further comprise, during the sampling phase, charging the DAC capacitor arrangement 230 to the second-level reference voltage VRP to obtain, at the circuit sense node 235 between the DAC capacitor arrangement 230 and the input capacitor 245, the sense-node voltage VSN. At least one effect can be that the DAC capacitor arrangement 230 is charged by the second-level reference voltage VRP. In contrast, during the charge redistribution phase, the DAC capacitor arrangement 230, according to the configuration of the capacitors' switches, is charged by the input voltage VIN provided at the input terminal 203. Thus, in order to charge the DAC capacitor arrangement, a voltage source can be used that is sufficiently large. At least one effect can be that another voltage source such as a reference voltage source may not be needed to charge the DAC capacitor arrangement 230. The method can further includes, during the charge redistribution phase, setting the input capacitor 245 to the input voltage VIN to obtain, at the circuit sense node 235, the sense node voltage VSN. The method can also comprise forming a digital output signal voltage DOUT that is representative of a difference between the threshold voltage VTH and the sense-node voltage VSN being positive or negative.

Another exemplary method for processing the input voltage VIN to compare the sense-node voltage VSN to the threshold voltage VTH includes using the input voltage VIN to store charge on the DAC capacitor arrangement 230. At least one effect can be that the DAC capacitor arrangement 230 is charged by the input voltage VIN provided at the input terminal 203. Thus, in order to charge the DAC capacitor arrangement a voltage source can be used that is sufficiently large. At least one effect can be that another voltage source such as a reference voltage source may not be needed to charge the DAC capacitor arrangement 230. The method can further comprise setting the input voltage VIN to the input capacitor 245, wherein the DAC capacitor arrangement 230 and the input capacitor 245 share the circuit sense node 235 in common, and setting a comparator sense node 51, 451 of the comparator circuit 55, 455 to the sense-node voltage VSN at the circuit sense node 235, wherein the charge on the DAC capacitor arrangement 230 is based on the output signal DOUT of the comparator circuit 55, 455. In some embodiments, configuring the DAC capacitor arrangement 230 is based on the output signal at the output node 57, 457 of the comparator circuit 55, 455. At least one effect can be that, depending on a configuration of the DAC capacitor arrangement 230, an amount of charge on the DAC capacitor arrangement 230 can be controlled.

In the above description of exemplary implementations, for purposes of explanation, specific numbers, materials configurations, and other details are set forth in order to better explain the invention, as claimed. However, it will be apparent to one skilled in the art that the claimed invention may be practised using different details than the exemplary ones described herein. Exemplary implementations/embodiments discussed herein may have various components collocated; however, it should be appreciated that the components of the arrangements may be combined into one or more apparatuses.

As used herein, the wording 'circuit block' and 'circuit portion' should be understood functionally. Therefore, in some implementations, a circuit block may not structurally appear as such in circuitry of a product; elements of the circuit block may be distributed in various locations of the circuitry of the product. Likewise, a circuit portion can be distributed.

As used herein, the word 'exemplary' means serving as an example, instance, or illustration. Any aspect or design described herein as 'exemplary' is not necessarily to be construed as preferred or advantageous over other aspects or designs. Rather, use of the word exemplary is intended to present concepts and techniques in a concrete fashion. The term 'techniques,' for instance, may refer to one or more devices, apparatuses, systems, methods, articles of manufacture, and/or computer-readable instructions as indicated by the context described herein.

As used herein, the terms 'coupled' and 'connected' may have been used to describe how various elements interface. Unless expressly stated or at least implied otherwise, such described interfacing of various elements may be either direct or indirect.

As used herein, the terms 'having', 'containing', 'including', 'with' or variants thereof, and like terms are open ended terms intended to be inclusive. These terms indicate the presence of stated elements or features, but do not preclude additional elements or features.

As used herein, terms such as 'first', 'second', and the like, are also used to describe various elements, regions, sections, etc. and are also not intended to be limiting. Where some implementations were described above with respect to a first and a second functionality, other implementations that are not illustrated can include only the first functionality (not second functionality) or can include only the second functionality (not the first functionality).

As used herein, the wording 'continuous' and 'to perform continuously' is not necessarily to be understood as unconditionally 'always'. Conditions such as a prerequisite for a certain continuous mode of operation can be defined to be met as a requirement for a continuous performance. The continuous performance can be defined to last as long as the conditions are met. One condition can be activation of a continuous mode of operation having a predetermined condition for deactivation such as completion of a predetermined duration or a signal for deactivation.

As used herein, the term 'or' is intended to mean an inclusive 'or' rather than an exclusive 'or.' That is, unless specified otherwise or clear from context, 'X employs A or B' is intended to mean any of the natural inclusive permutations. That is, if X employs A; X employs B; or X employs both A and B, then 'X employs A or B' is satisfied under any of the foregoing instances.

As used herein, the articles 'a' and 'an' should generally be construed to mean 'one or more,' unless specified otherwise or clear from context to be directed to a singular form.

As used herein, the wording 'reset' encompasses a recharge of capacitors in order to replace charge that leaked, for example, during the first mode of operation, from the capacitors; a recharge of capacitors is also referred to as a 'capacitor refresh'. A reset can also encompass a re-adjustment, for example to accommodate a fluctuation due to a change in temperature of the comparator, of the comparator offset. A reset, in some cases, can also include a reconfiguration of the DAC capacitor arrangement.

In some embodiments a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods can be performed by any hardware apparatus.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a 'means') used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. It is to be understood that the features of the various embodiments described herein may be combined with each other, unless specifically noted otherwise.

The invention claimed is:

1. A method of processing an input voltage, comprising:
   during a sampling phase, using a digital-to-analog converter (DAC) capacitor to sample a reference voltage; and
   during a charge redistribution phase, using an input voltage to charge the DAC capacitor.

2. The method of claim 1, the method further comprising:
   during the sampling phase, short-circuiting a comparator sense node to a common mode node of a voltage generator.

3. The method of claim 2, wherein the common mode node is a comparator output node.

4. The method of claim 2, wherein the comparator sense node is coupled to the DAC capacitor.

5. The method of claim 1, the method further comprising:
   during the sampling phase, using an input capacitor to sample a predetermined bias voltage; and
   during the charge redistribution phase, using the input voltage to charge the input capacitor.

6. The method of claim 5, wherein a comparator sense node is coupled to the input capacitor.

7. The method of claim 1, the method further comprising:
   during the charge redistribution phase, configuring the DAC capacitor based on a comparator output signal.

8. The method of claim 7, wherein configuring the DAC capacitor comprises selectively switching switched capacitors of the DAC capacitor to the input voltage or to a first-level reference voltage that differs from a second-level reference voltage that is the reference voltage.

9. The method of claim 7, the method further comprising:
   during the charge redistribution phase, successively approximating the input voltage by setting DAC capacitor switches.

10. The method of claim 7, the method further comprising:
    during the charge redistribution phase, tracking the input voltage by setting DAC capacitor switches.

11. The method of claim 9, the method further comprising:
    based on the settings of the DAC capacitor switches, controlling a voltage source that provides the input voltage.

12. The method of claim 11, the method further comprising:

during the charge redistribution phase, controlling the voltage source to keep the input voltage essentially constant.

13. The method of claim 11, the method further comprising:
using the voltage source to supply a circuit with power.

14. A circuit for processing an input voltage, comprising:
a comparator; and
a DAC capacitor coupled between an input node to the circuit and a sense node of the comparator, wherein the DAC capacitor is configured to sample, during a sampling phase, a reference voltage, and to be charged, during a charge redistribution phase, by an input voltage.

15. The circuit of claim 14, wherein the circuit is configured to alternately connect the DAC capacitor to a first-level reference voltage node being set to the reference voltage and to the input node of the circuit.

16. The circuit of claim 14, wherein the circuit is configured to alternately connect the DAC capacitor to the second-level reference voltage node being set to the reference voltage and either to the input voltage node or to a first-level reference voltage node.

17. The circuit of claim 14, further comprising an input capacitor coupled between a bias voltage node of the circuit and the sense node of the comparator.

18. The circuit of claim 17, wherein the circuit is configured to alternately connect the input capacitor to the bias voltage node and to the DAC capacitor.

19. The circuit of claim 14, wherein the circuit is configured, during a sampling phase, to short-circuit the sense node of the comparator to a common mode node of a voltage generator, and during a charge redistribution phase, to disconnect the sense node of the comparator from the common mode node of the comparator.

20. The circuit of claim 19, wherein the common mode node comprises a comparator output node.

21. The circuit of claim 19, wherein the circuit is configured, during the sampling phase, to couple the input capacitor to the bias voltage node.

22. The circuit of claim 19, wherein the circuit is configured, during the sampling phase, to couple the DAC capacitor to the first-level reference voltage node to charge the DAC capacitor to the first-level reference voltage as the reference voltage, and wherein the circuit is configured, during the sampling phase, to connect the DAC capacitor to the second-level reference voltage node to charge the DAC capacitor to the second-level reference voltage as the reference voltage.

23. The circuit of claim 14, wherein the circuit is configured to control a configuration of the DAC capacitor.

24. The circuit of claim 23, wherein the configuration of the DAC capacitor includes settings of a plurality of switched capacitors.

25. The circuit of claim 24, wherein the plurality of switched capacitors are thermometer switched and non-linearly weighted.

26. The circuit of claim 24, wherein the plurality of switched capacitors are configured to be selectively set to connect to the input voltage node or to the first-level reference voltage node.

27. The circuit of claim 24, wherein the second-level reference voltage differs from the first-level reference voltage by semiconductor band-gap voltage.

28. The circuit of claim 23, wherein the circuit is configured to control, based on the configuration of the DAC capacitor, a voltage source that provides the input voltage.

29. The circuit of claim 23, wherein the circuit is configured to determine the configuration of the DAC capacitor at the end of the charge redistribution phase.

30. A circuit for converting a first direct voltage to a second direct voltage, comprising:
an analog-to-digital converter configured to form a digital representation of an analog direct voltage,
wherein the analog-to-digital converter includes a digital-to-analog converter (DAC) capacitor coupled between an input node of the circuit set to the analog direct voltage and a sense node of a comparator,
wherein the DAC capacitor is configured to sample the analog direct voltage.

* * * * *